(12) United States Patent
Ogawa et al.

(10) Patent No.: US 6,566,736 B1
(45) Date of Patent: May 20, 2003

(54) DIE SEAL FOR SEMICONDUCTOR DEVICE MOISTURE PROTECTION

(75) Inventors: Hiroyuki Ogawa, Sunnyvale, CA (US); Yider Wu, Campbell, CA (US); Yu Sun, Saratoga, CA (US)

(73) Assignees: Advanced Micro Devices, Inc., Sunnyvale, CA (US); Fujitsu Limited, Kanagawa (JP)

( * ) Notice: Subject to any disclaimer, the term of this patent is extended or adjusted under 35 U.S.C. 154(b) by 0 days.

(21) Appl. No.: 09/998,624

(22) Filed: Nov. 30, 2001

(51) Int. Cl.[7] ............................................. H01L 23/544
(52) U.S. Cl. ..................... 257/620; 257/618; 257/626; 257/640; 257/632; 257/629; 257/649; 257/635; 257/760; 257/758; 257/701
(58) Field of Search ................................. 257/787, 788, 257/790, 618, 619, 620, 626, 629, 632, 640, 649, 635, 760, 700, 701, 758, 173

(56) References Cited

U.S. PATENT DOCUMENTS

| | | |
|---|---|---|
| 5,583,370 A | 12/1996 | Higgins, III et al. |
| 5,831,330 A | 11/1998 | Chang |
| 6,437,444 B2 * | 8/2002 | Andideh ............... 257/758 |
| 2001/0000012 A1 * | 3/2001 | Andideh ............... 257/760 |
| 2001/0042922 A1 * | 11/2001 | Mikagi ............... 257/760 |
| 2002/0125577 A1 * | 9/2002 | Komada ............... 257/774 |

* cited by examiner

Primary Examiner—Nathan J. Flynn
Assistant Examiner—Pershelle Greene
(74) Attorney, Agent, or Firm—Eschweiler & Associates, LLC

(57) ABSTRACT

Moisture seal apparatus and methodologies are disclosed for protecting semiconductor devices from moisture. An upper seal layer, such as SiN is formed over an upper insulator layer and an exposed portion of a die seal metal structure so as to form a vertical moisture seal between electrical components in the semiconductor device and the ambient environment. A lateral seal may be formed from the die seal metal structure in an upper metal layer in the device and one or more contacts extending downward from the die seal metal to the substrate or to a lower die seal metal structure.

20 Claims, 10 Drawing Sheets

DIE SEAL FOR SEMICONDUCTOR DEVICE MOISTURE PROTECTION

FIELD OF INVENTION

The present invention relates generally to semiconductor devices and more particularly to die seal structures and methods for protecting semiconductor devices from moisture.

BACKGROUND OF THE INVENTION

Semiconductor devices, such as integrated circuits (ICs), are typically manufactured by forming multiple devices and interconnections (e.g., circuits) on a semiconductor wafer, which are then separated into individual parts or dies. Individual devices are located within corresponding die areas on the wafer with sufficient spacing provided between adjacent devices for subsequent separation operations and the manufacturing tolerances associated therewith. Typically, the devices are oriented in grid style on the wafer, with rows and columns of devices located on the top or front side of the wafer. The devices are formed using multi-step processing involving selective deposition, removal, and/or doping of active regions on the wafer surface to build electrical components (e.g., memory cells, transistors, diodes, resistors, capacitors, etc.) and connections therebetween. Within a particular die area, many electrical components are thus formed, and are interconnected with one another using one or more overlying metal layers, by which an integrated circuit device is produced. Thereafter, the individual dies or devices are separated from the wafer.

Following die separation, individual dies may then be assembled into integrated circuit chips. In constructing an integrated circuit chip, a semiconductor die is mounted onto a lead frame and wires are connected between lead frame leads and corresponding bonding pads on the die using a technique known as wire bonding. Wire bonding involves attachment of fine aluminum or gold wires to the die bonding pads through various bonding techniques, such as thermocompression bonding or ultrasonic bonding. Once the pads on the die are appropriately connected to the lead frame leads, the lead frame is encapsulated in a ceramic or plastic package, which may then be assembled onto a printer circuit board (PCB) by soldering the exposed portions of the leads onto corresponding conductive pads on the board. Alternatively, the dies may be mounted directly onto PCBs, where electrical connections are made between conductive circuit board pads and electrically conductive bonding pads on the dies. In this regard, Flip-Chip technology has recently become popular, wherein an individual semiconductor die is mounted directly to a circuit board. Bumps (e.g., solder bumps, plated bumps, gold stud bumps, adhesive bumps, or the like) are added to the bonding pads of the die using a process known as bumping. With stud bumps attached, the die or chip is then "flipped" over, with the bonding pads facing downward, and the bumps are attached to corresponding pads on the PCB using, for example, ultrasonic or other bonding techniques.

Moisture is known to cause adverse effects in the operational reliability and/or longevity of semiconductor devices. For example, where the electrical components within an active region of a semiconductor die are exposed to moisture, the characteristics of the transistors, memory cells, or the like may be affected. Thus, in a flash memory device, for instance, internal exposure to such moisture may change the programmed and/or erased threshold voltages associated with one or more memory cell structures therein, resulting in reduced reliability for storing or providing access to user data. During semiconductor device fabrication, as well as during subsequent bonding, packaging, and eventual operation of the device die (e.g., mounted in an integrated circuit package or directly on a circuit board), the exterior of the die may be exposed to a moist ambient operating environment. Where such moisture invades the electrical component areas of the device, operational degradation may result. It is therefore desirable to prevent or reduce the likelihood of such moisture entering the interior active regions of the device die, both during manufacturing and thereafter.

Various attempts have previously been made to seal the interior of the semiconductor device dies from such ambient moisture. The bottom substrate in most semiconductor devices (e.g., silicon) effectively blocks moisture from entering the interior of the die from the bottom, but materials commonly employed in fabricating further layers above the substrate provide a path for moisture to enter from the top and/or sides of the die following die separation. For example, certain commonly employed insulator materials such as silicon oxide (SiO) are relatively easily penetrated by moisture. Accordingly, lateral or side seal structures are often provided between the die edges and the active region. Such side seal structures are formed in one or more layers in the processed semiconductor device using vertically oriented contacts (e.g., such as tungsten) and metal die seal structures, wherein the contacts and die seal metal structures extend around the periphery of the active region of each individual die.

Each layer formed between the bottom substrate and the upper most metal layer typically includes such a structure, by which a vertical moisture barrier extends laterally around the periphery of the device active region from the bottom substrate to the upper most metal layer. Thus, where multiple metal connection layers are employed in a device fabrication process, the lower most die seal contacts extend from the substrate to a metal die seal structure in the first metal layer. Additional contacts are formed in an overlying insulator material, which extend upward from the metal die seal structure in the first metal layer to a similar seal structure in the second metal layer. This structure is then repeated for each successive metal layer until the final metal layer is formed.

In the past, moisture has been prevented from entering the die active region by an upper seal or liner layer directly overlying the upper most metal layer. A final insulator layer, such as SiO is then formed over the liner. Openings are made (e.g., etched) in the liner and final insulator layers so as to expose die bonding pads in the upper most metal layer for wire bonding after die separation. Thus, in the interior of the active region, the liner layer and the exposed metal bonding pads provide a seal against moisture entering from the top of the die. Furthermore, because the liner layer is formed directly over the final metal layer, a moisture seal is provided at the peripheral edges of the active region, where the liner layer is formed directly over the metal die seal structure in the top metal layer. Thus, although moisture may pass from the top ambient through the upper most SiO insulator layer, the liner layer prevents further downward moisture transfer to the electrical components below.

However, the use of such a liner overlying the upper metal layer may cause problems in the operation of the circuitry in the semiconductor device. For instance, in order to satisfy the demand for more and more functionality in modern semiconductor products, there is a continuing trend toward higher device densities. Such higher device densities, in turn, are facilitated by reduction in the device dimensions achieved through smaller and smaller features sizes. These feature sizes include the width and spacing of interconnecting lines in the various metal layers, which have recently become smaller to the point where electrical characteristics of the liner layer overlying the upper most metal layer features may have an adverse effect on the device performance. Thus, there is a need for improved moisture sealing structures and methodologies by which the semiconductor device and the components therein can be protected from moisture, without adversely affecting the circuit operation.

SUMMARY OF THE INVENTION

The following presents a simplified summary of the invention in order to provide a basic understanding of some aspects of the invention. This summary is not an extensive overview of the invention, and is intended neither to identify key or critical elements of the invention nor to delineate the scope of the invention. Rather, the primary purpose of this summary is to present some concepts of the invention in a simplified form as a prelude to the more detailed description that is presented later. The invention provides moisture seal apparatus and methodologies for protecting semiconductor devices from moisture, by which the above mentioned and other shortcomings associated with prior techniques may be mitigated or overcome.

One aspect of the invention provides semiconductor devices and moisture seal structures therefor in which an upper seal layer, such as silicon nitride (SiN) or an equivalent sealing material, is formed over an upper insulator layer and an exposed portion of a die seal metal structure so as to form a vertical moisture seal between electrical components in the semiconductor device and the ambient environment. A lateral moisture seal may be formed from the die seal metal structure in an upper metal layer in the device and one or more contacts extending downward from the die seal metal to the substrate or to a lower die seal metal structure. Together with the underlying bottom substrate, a moisture seal is thus provided to protect the internal active die region and the electrical components therein from the adverse effects of moisture.

In addition to providing a moisture seal, the invention may advantageously mitigate adverse effects of the electrical properties of the upper seal layer on the device operation. For example, the inventors have found that as line spacings in the upper metal layer are decreased to provide interconnection in high feature density devices, the dielectric properties of a liner layer directly formed on the upper metal layer may cause capacitive problems in circuit operation, where the liner material formed between adjacent signal line connection features creates a capacitor therebetween. In this regard, the inventors have found that the present invention advantageously allows silicon oxide (SiO) or other insulator layers to be formed directly above the upper most metal layer features, by which a reduction in such undesirable capacitive effects of the seal layer may be achieved.

Another aspect of the invention provides techniques for protecting a semiconductor device against moisture, comprising forming a seal structure in a final metal layer in the semiconductor device and forming an upper insulator layer overlying the final metal layer. The upper insulator layer may be formed, for example, using SiO, which has limited adverse capacitive effects on adjacent signal lines in the upper metal layer. A portion of the seal structure is exposed through the upper insulator layer, and an upper seal layer is then formed, which overlies the upper insulator layer and an exposed portion of the seal structure. By this technique, the effects of the electrical characteristics (e.g., such as dielectric properties) of the seal layer on the circuitry in the device may be mitigated.

To the accomplishment of the foregoing and related ends, the following description and annexed drawings set forth in detail certain illustrative aspects and implementations of the invention. These are indicative of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
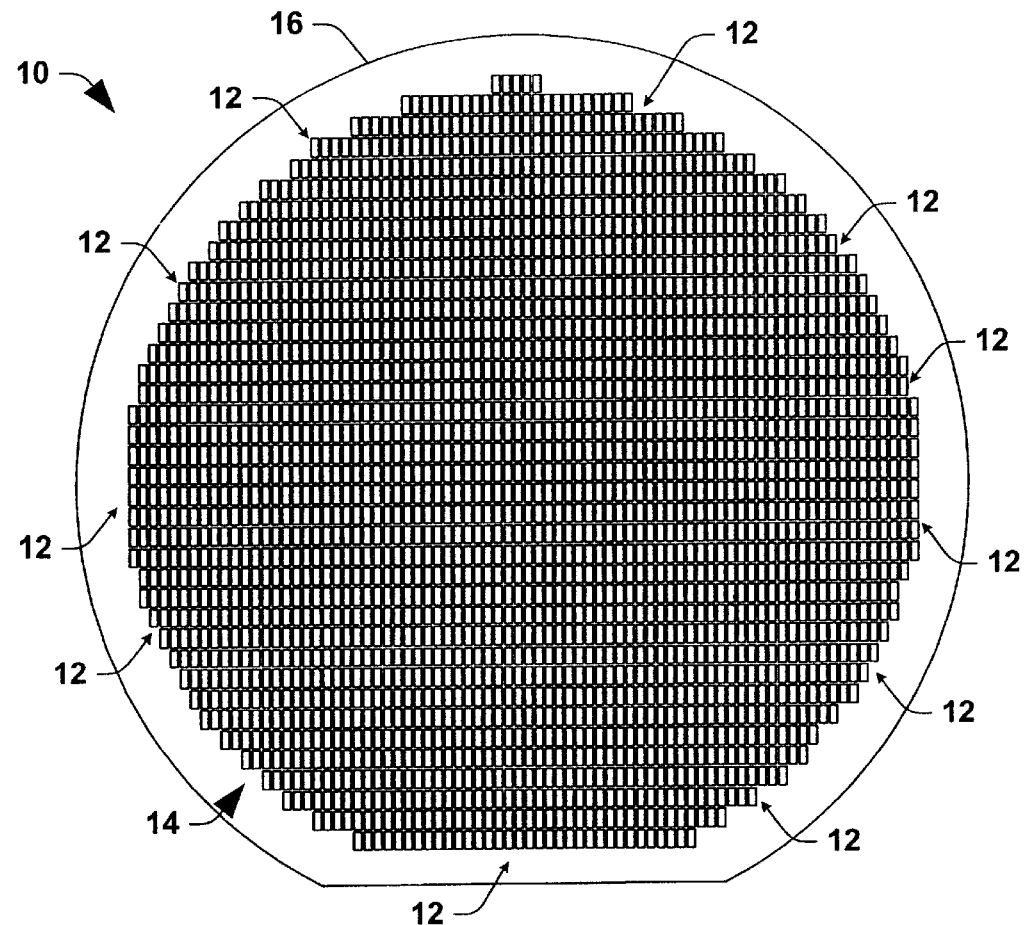
FIG. 1 is a top plan view illustrating an exemplary semiconductor wafer with a plurality of dies having active regions in which separate electrical circuits may be formed with spacer regions therebetween.
Figure 2:
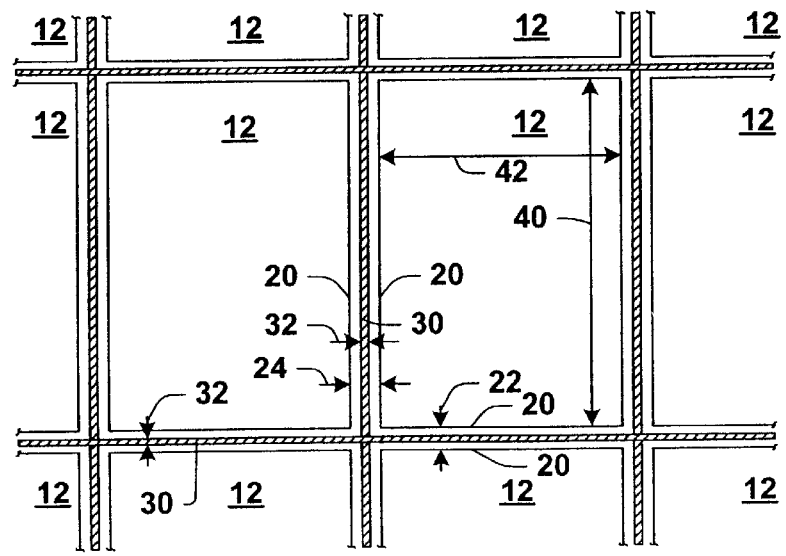
FIG. 2 is a top plan view of a portion of the wafer of FIG. 1 further illustrating several of the active die regions and spacer regions therebetween, together with scribe lines cut into the spacer regions for die separation.

One or more implementations of the present invention will now be described with reference to the drawings, wherein like reference numerals are used to refer to like elements throughout. The present invention relates to moisture seal apparatus and methodologies for protecting semiconductor devices from moisture. An exemplary semiconductor wafer 10 is illustrated in FIGS. 1 and 2 in which one or more aspects of the present invention may be carried out. Prior to die separation, the wafer 10 comprises a bottom substrate 16, such as silicon (Si) having die areas or active regions 12 located in rows and columns in the top side 14 of the wafer 10. The active die regions 12 are illustrated having lengths 40 and widths 42 defined by generally rectangular peripheral boundaries 20 within which individual electrical components and circuits (not shown) are formed on the top side and within the wafer 10 according to known practices, wherein the die areas are spaced vertically and horizontally by spacings 22 and 24.

Scribe lines or channels 30 having widths 32 are saw cut into the spacings 22 and 24 to separate the individual dies 12 from the wafer 10 following formation of the electrical components and interconnections thereon. The scribe lines 30 define spacer regions along the lateral periphery of the individual devices, outlying the active regions 12 between the boundaries 20 and the lateral sides of the individual die devices following separation. As described further below, lateral or side seal structures may be formed along the peripheral boundaries 20 in accordance with the invention, which cooperate with upper seal layers or structures and the bottom substrate so as to protect the individual dies 12 from moisture following die separation.

Figure 3:
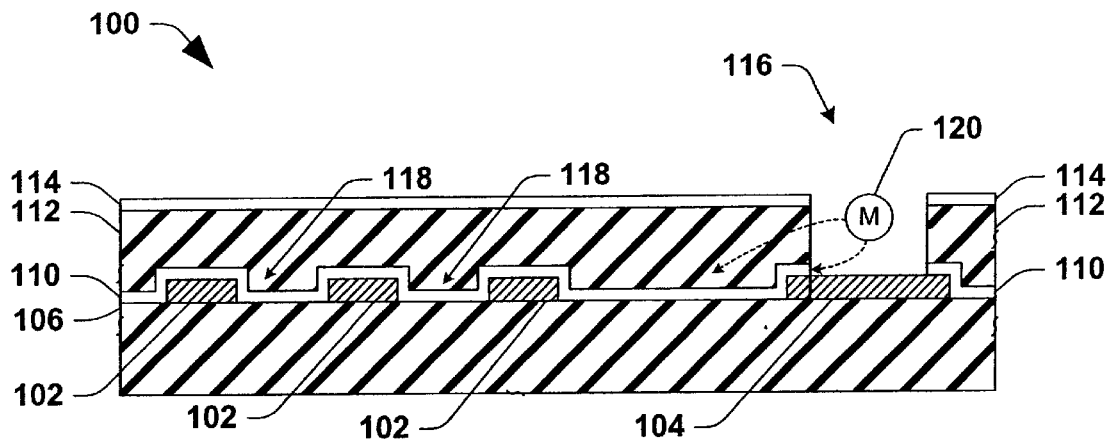
FIG. 3 is a partial side elevation view in section illustrating a portion of a semiconductor device having moderate metal layer line spacing, wherein a liner layer is formed directly over an upper metal layer.

FIG. 3 illustrates a partial sectional view of a conventional die seal approach in which an upper portion of a semiconductor device 100 comprises an upper metal layer with various line features 102 and a metal contact pad 104 overlying an insulator layer 106, wherein the insulator layer 106 is made of silicon oxide (SiO). As has been done in the past, a seal liner layer 110, such as silicon nitride (SiN) is formed directly over the features 102, 104 of the upper most metal layer, and an upper SiO insulator layer 112 overlies the liner 110. A further SiN layer 114 is formed over the upper SiO layer 112, and a recess 116 is formed through the layers 110, 112, and 114 (e.g., such as through selective etching using photo masks and appropriate lithographic techniques) in order to expose a portion of the metal contact pad feature 104 for subsequent wire bonding or stud bumping to facilitate connection thereof to a lead frame lead or a circuit board pad.

Due to the relative spacing of the metal line features 102 and the thickness of the liner layer 110, the spaces 118 laterally between adjacent lines 102 comprise both SiN 110 as well as SiO 112, whereby the dielectric properties of the SiO material 112 in the spaces 118 mitigates capacitive effects associated with the dielectric properties of the liner SiN material 110. The structure of FIG. 1 provides an upper moisture seal by virtue of the seal layer 110 and the exposed portion of the metal pad feature 104, whereby moisture 120 is prevented from entering the active region below the seal layer 110.

Figure 4:
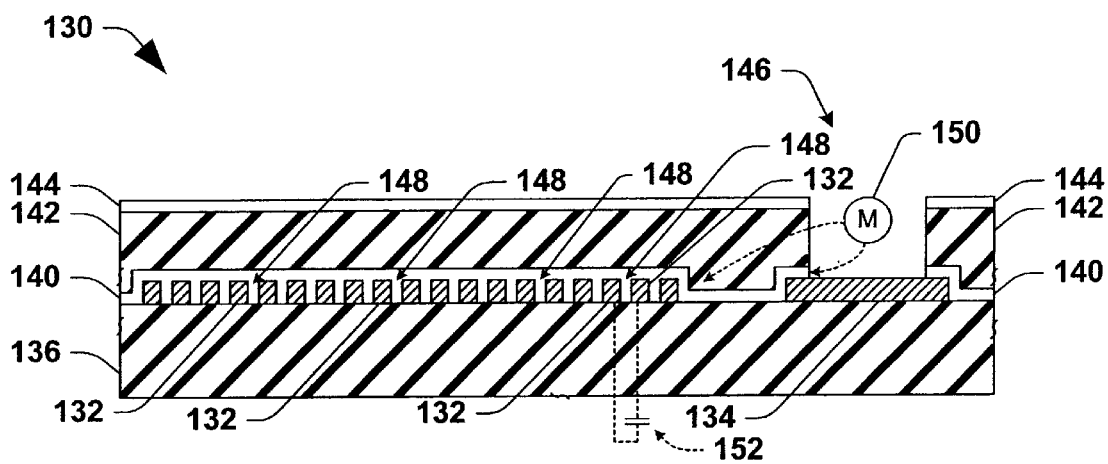
FIG. 4 is a partial side elevation view in section illustrating a portion of another semiconductor device having closer metal layer line spacing, wherein a liner layer formed directly over the upper metal layer creates unwanted capacitances between adjacent line features.

Referring now to FIG. 4, an upper portion of another semiconductor device 130 is illustrated comprising an upper metal layer with various line features 132 and a metal contact pad 134 overlying a SiO insulator layer 136. A SiN seal liner layer 140 is formed directly over the features 132, 134 of the upper most metal layer, and an upper SiO insulator layer 142 overlies the liner 140. A further SiN layer 144 is formed over the upper SiO layer 142, and a recess 146 is formed through the layers 140, 142, and 144 in order to expose a portion of the metal contact pad feature 134 for subsequent wire bonding or stud bumping. It is noted that unlike the metal line features 102 of FIG. 3, the lines 132 in FIG. 4 are fine pitch, wherein the relative spacing therebetween are small. Because of the fine pitch, and the aspect ratio of the line features 132, as well as the thickness of the liner layer 140, the lateral spaces 148 between adjacent lines 132 are filled entirely with SiN 140.

Figure 5:
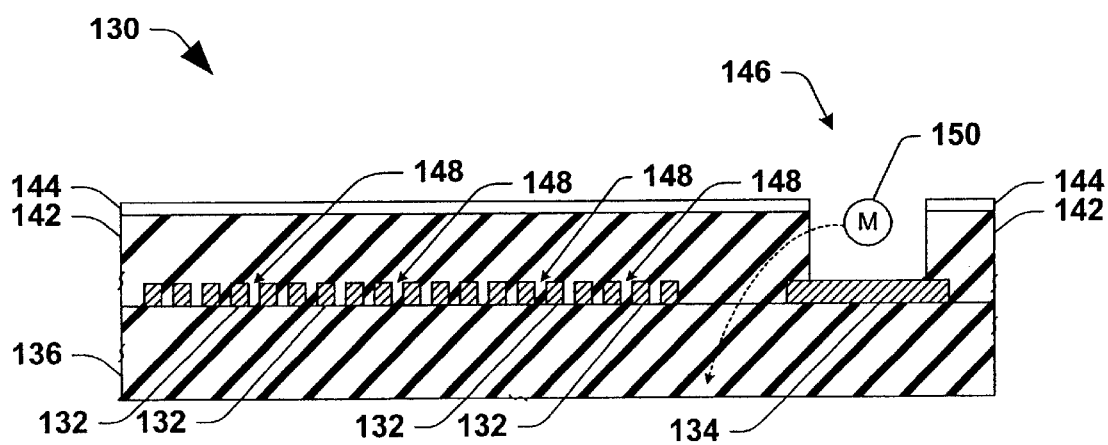
FIG. 5 is a partial side elevation view in section illustrating a portion of the device of FIG. 4 with no liner layer overlying an upper metal layer and the resulting moisture seal problems.

As a result, the inventors have found that unwanted capacitances 152 are formed between adjacent line features 132, due to the dielectric characteristics of the SiN material in the liner layer 140. Thus, it has been found that while the SiN material 140 provides good sealing properties in preventing or inhibiting entry of moisture 150 into the interior of the device 130, the dielectric properties of SiN are less desirable than SiO, particularly where fine pitch line features are employed in an upper metal layer. However, as noted above, SiO is largely ineffective as a moisture sealant. Accordingly, the inventors have appreciated that as device densities continue to increase and upper metal layer line spacings 148 continue to decrease, the SiN seal layer 140 directly above the upper metal layer features 132, 134 is an undesirable moisture seal solution by virtue of the unwanted capacitances 152. Referring also to FIG. 5, the inventors have further appreciated that simply removing the SiN layer 140 from the device 130, while addressing the capacitances 152, allows moisture 150 to easily pass through the SiO layers 142 and 136, resulting in a potential degradation in performance of the device 130. Thus, it is noted from FIGS. 3–5 that improved semiconductor device moisture protection structures and techniques are needed, particularly for application in high device density applications.

Figure 6:
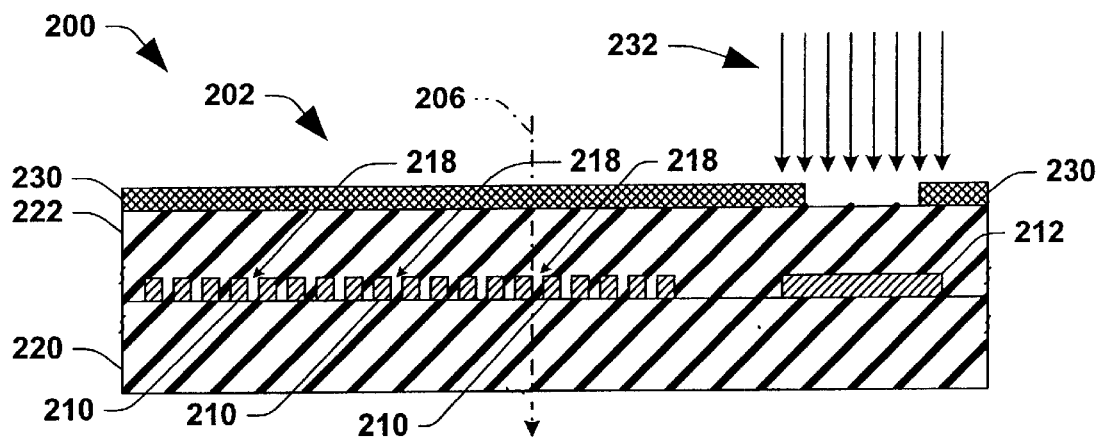
FIG. 6 is a partial side elevation view in section of a portion of another semiconductor device illustrating exposure of a portion of a metal layer pad through an upper insulator layer using a first pad mask in accordance with the present invention.

Referring now to FIGS. 6–11, formation of a new upper moisture seal is illustrated and described hereinafter in accordance with the present invention. In FIG. 6 an upper portion of an active region of a semiconductor device die 200 is illustrated extending longitudinally between a top 202 and a substrate bottom (not shown) along an axis 206, where one or more electrical components are formed in the underlying portions (not shown) of the active region of the device 200. One or more metal layers overlie the electrical components and bottom substrate, including an upper most or final metal layer having line and pad components 210 and 212, respectively, wherein the line features 210 and the metal pad feature 212 are connected to various electrical components via tungsten or other type of contacts (not shown) extending through an SiO insulator layer 220. The metal pad 212 in the final metal layer is used for connection of the circuitry of the device 200 with other components or circuits outside the device 200, such as by wire bonding to lead frame leads or by bumping for direct connection to a circuit board.

As further illustrated and described below with respect to FIGS. 13–22, a seal structure may be formed in each metal layer, including the final metal layer, at the peripheral boundaries of the active region of the device 200 to provide lateral moisture sealing in accordance with an aspect of the present invention. The final metal layer features 210, 212 are formed over a SiO insulator layer 220, and an upper SiO insulator layer 222 is formed directly over the final metal layer features 210, 212. It will be appreciated that the formation of the SiO layer 222 over the final metal layer features 210 advantageously mitigates the unwanted capacitances associated with the SiN liner layer 140 of FIG. 4 where the spacings 218 between adjacent metal line features 210 are small (e.g., fine line pitch), because of the dielectric properties of SiO compared with those of SiN. However, as noted above, SiO is a poor moisture sealant, and hence an upper moisture seal is formed as described below.

Figure 7:
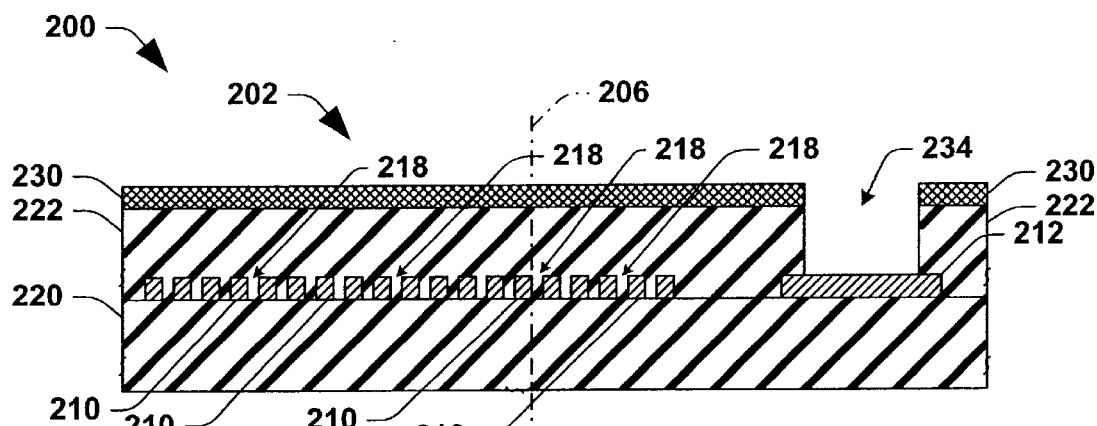
FIG. 7 is a partial side elevation view in section illustrating an exposed portion of the metal layer pad of the device of FIG. 6.
Figure 8:
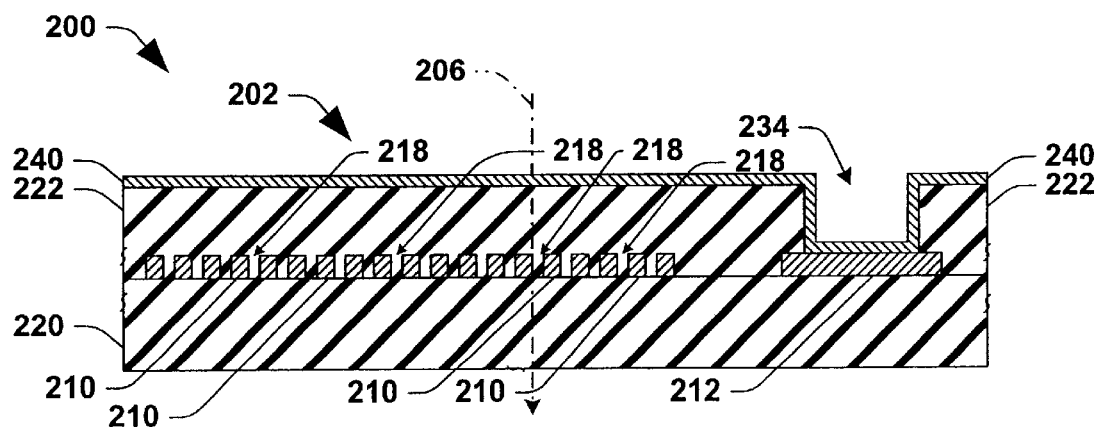
FIG. 8 is a partial side elevation view in section illustrating formation of an upper seal layer over an upper insulator layer in the device of FIGS. 6 and 7.

Because the metal pad feature 212 is to be used for external electrical connection, a portion thereof is exposed through the SiO layer 222 using a first pad mask 230 and an etch process 232. The first pad mask 230 (e.g., as well as a second pad mask 242 illustrated and described below with respect to FIGS. 9 and 10) may be formed using any appropriate techniques, such as by deposition of photo resist material, exposure thereof using a photo mask, and removal of unwanted resist material to form the mask 230, by which the first pad mask 230 is formed having openings corresponding to areas of the underlying material for which etching is desired, and etch resistant material elsewhere. Referring also to FIG. 7, the etch process 232 selectively removes SiO material from the upper insulator layer 222 to create a recess 234, thereby exposing a portion of the metal pad feature 212 using the first pad mask 230. However, as noted above, the upper SiO layer 222 is ineffective to protect the internal electrical components of the device 200 from exposure to moisture (e.g., as illustrated in FIG. 5). Thus, the first pad mask 230 is removed, and an upper seal layer 240 is formed, such as SiN, over the upper insulator layer 222, as illustrated in FIG. 8. In FIG. 8, the upper seal layer 240 extends over the upper portions of the SiO layer 222, as well as the exposed portion of the metal pad feature 212 and the SiO side walls of the recess 234.

Figure 9:
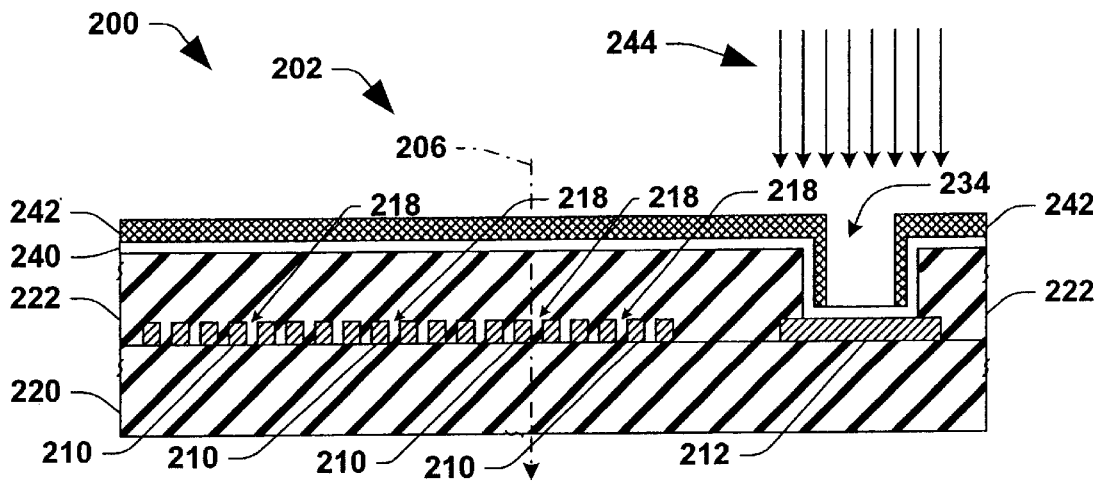
FIG. 9 is a partial side elevation view in section illustrating exposure of another portion of the metal layer pad through the upper seal layer of FIG. 8 using a second pad mask.
Figure 10:
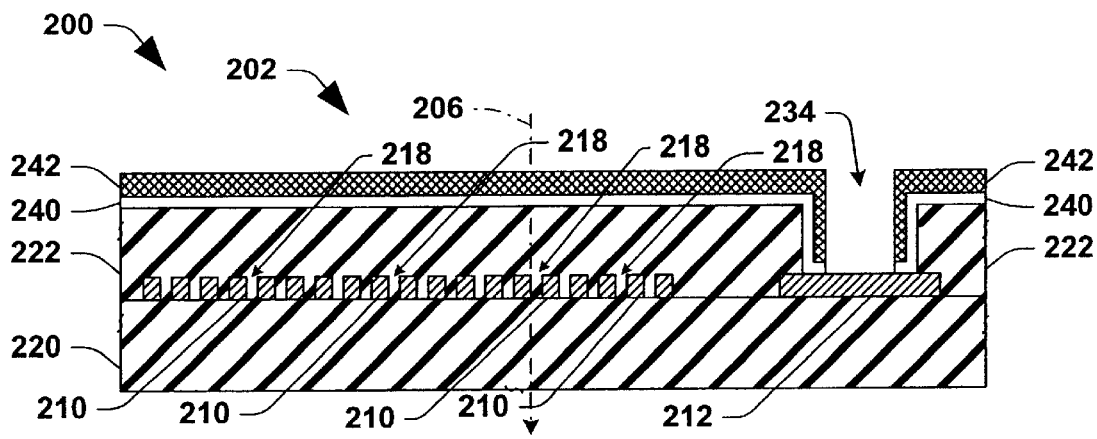
FIG. 10 is a partial side elevation view in section illustrating an exposed portion of the metal layer pad through the upper seal layer of FIG. 9.
Figure 11:
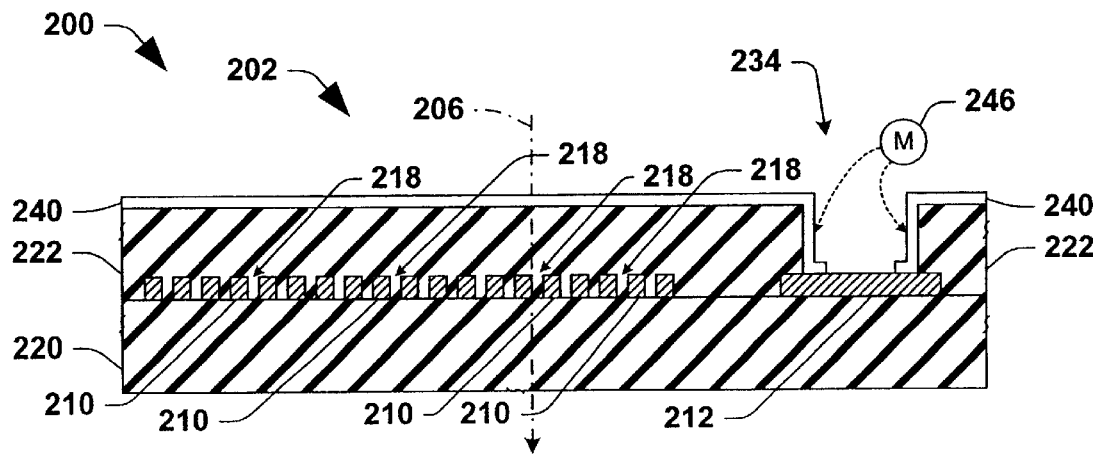
FIG. 11 is a partial side elevation view in section illustrating the device of FIG. 10, wherein the metal layer pad and the upper seal layer operate to provide a moisture seal.

Referring also to FIG. 9, a second pad mask 242 is then formed over the upper seal layer 240, including the SiN sidewalls of the recess 234 and a portion of the SIN material overlying the metal pad 212, while leaving the remainder of the SiN overlying the pad 212 exposed. An etch process 244 is then performed on the device 200, which selectively removes the exposed SiN material from layer 240 overlying the metal pad 212 at the bottom of the recess 234, as illustrated in FIG. 10. Thereafter, the second pad mask 242 is removed, leaving the resulting structure of FIG. 11. It is noted in FIG. 11, that moisture 246 is unable to penetrate the internal components of the active region of the device 200, by virtue of the upper SiN seal layer 240 extending over the upper SiO insulator layer, and a portion of the exposed portion of the metal pad feature 212. In this regard, the SiN material 240 and the metal pad 212 provide an upper seal structure over the top 202 of the device 200 to protect the device 200 from the adverse effects of the moisture 246.

Figure 12A:
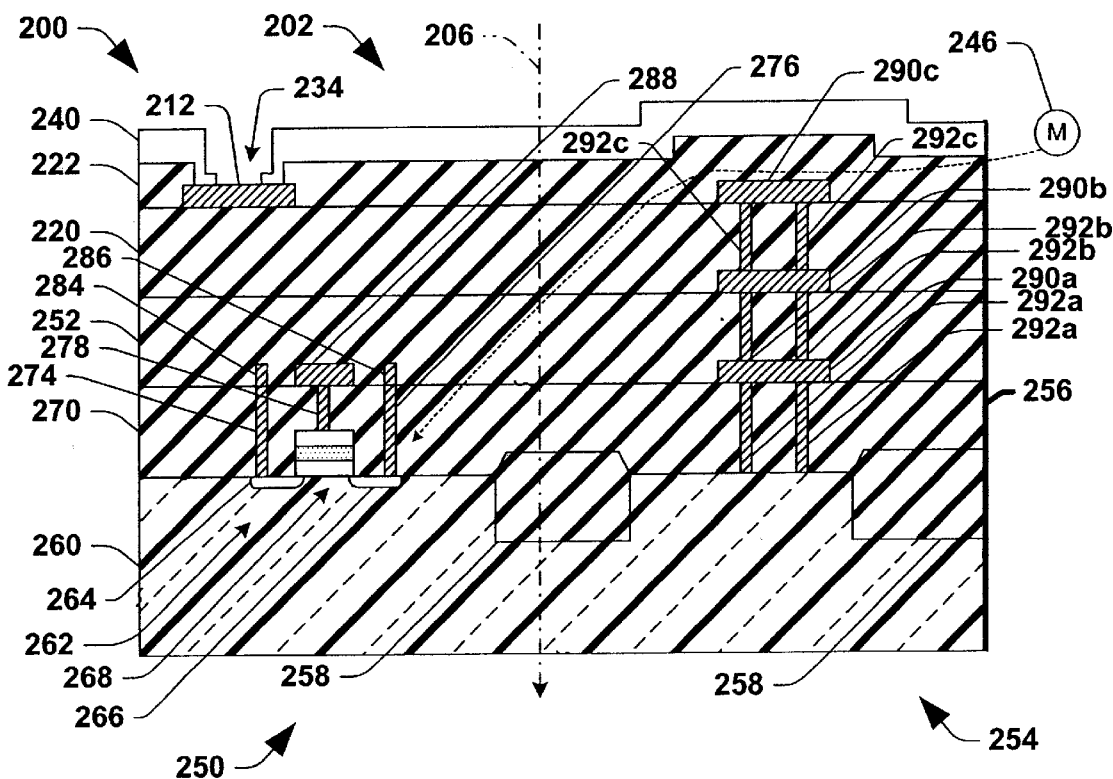
FIGS. 12a and 12b are partial side elevation views in section illustrating an end portion of the device of FIG. 10 after die separation, wherein moisture can access electrical components in an active region thereof between a side seal structure and the upper seal layer.
Figure 12B:
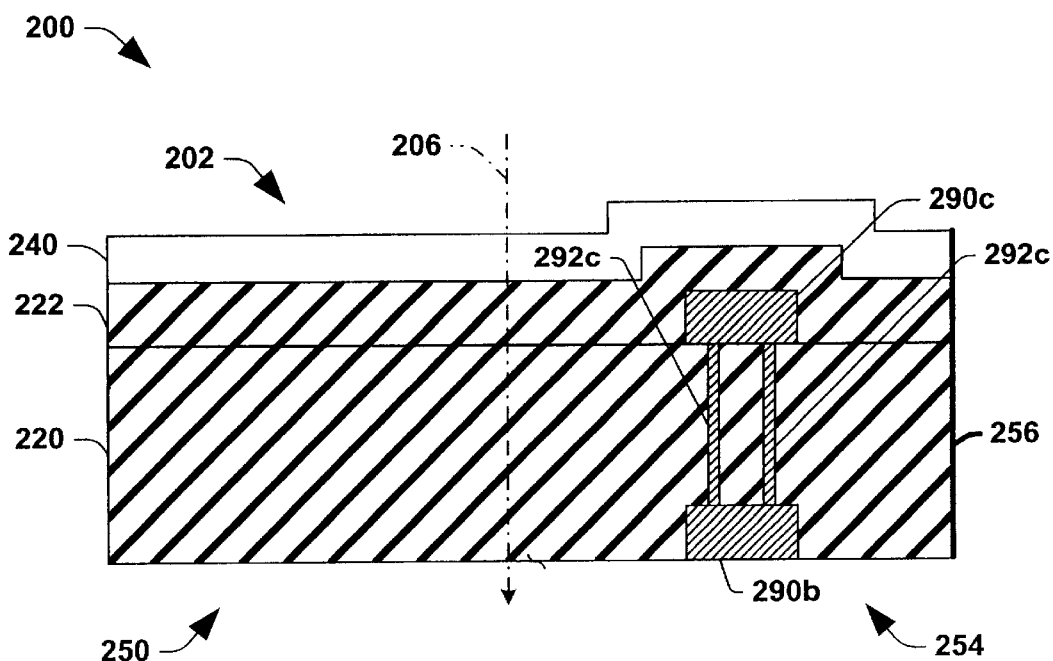

Referring now to FIGS. 12a and 12b, an end portion of the exemplary semiconductor device 200 is illustrated, wherein the upper portions thereof, illustrated and described above, are formed over one or more underlying metal/insulator layers and a bottom substrate 260. One or more electrical components, such as a flash memory cell 262 are formed in the device 200, for example, wherein a source 264, and a drain 266 are formed in the substrate 260, with a stacked gate 268 formed over the substrate 260. A lower insulator layer 270 overlies the bottom substrate 260 with conductive contacts 274, 276, and 278 extending therethrough to an overlying first metal later. The contacts 274, 276, and 278 provide electrical connection of the source 264, drain 266, and gate 268 to metal features 284, 286, and 288 in the first metal layer, for connection of the source 264, drain 266, and gate 268, respectively, to other components in the device 200 and/or to contact pads (e.g., such as the pad 212) for connection thereof with external circuitry.

Additional metal layers may be formed in the device 200, so as to facilitate desired routing and interconnection of the memory cell 262 and other electrical components in an active region 250 of the device 200, wherein an intermediate insulator layer 252 is formed over the first metal layer including features 284, 286, and 288, for example, of SiO material, and a second metal layer is formed over the insulator layer 252. The second metal layer underlies the insulator layer 220 illustrated and described above, and the upper most third or final metal layer overlies the insulator layer 220, having metal pad feature 212. As described above with respect to FIGS. 6–11, an upper insulator layer 222 is formed over the upper metal layer and the insulator layer 220, over which the seal layer 240 (e.g., SiN) is formed.

The lower and intermediate insulator layers and metal layers may also be used to form a side seal structure for protecting the device 200 against moisture entering laterally from peripheral edges thereof following die separation. In addition, it is noted that the bottom substrate 250 seals the bottom of the device 200 against moisture penetration from the bottom ambient. The side seal structure in the exemplary device 200 comprises metal die seal structures 290a, 290b, and 290c in the first, second, and third or final metal layers, respectively, as well as vertically extending contacts 292a, 292b, and 292c extending downwardly from the die seal metal structures 290a, 290b, and 290c through the insulator layers 270, 252, and 220, respectively. The contacts 292c extend longitudinally between the seal structures 290c and 290b, the contacts 292b extend between the seal structures 290b and 290a, and the lower most contacts 292a extend downward from the seal structure 290a to the bottom substrate 260, whereby a lateral moisture seal barrier is formed between the active region 250 and a spacer region 254 at the peripheral sides of the device 200. In the illustrated device 200, one or more shallow trench isolation regions 258 are also provided in the bottom substrate 260.

The spacer region 254 extends around the periphery of the individual die areas of a wafer during fabrication, and extends between the active region 250 and a lateral side 256 of the individual die device 200 following die separation. Thus, the side seal structure in the exemplary device 200 defines a boundary (e.g., boundary 20 of FIG. 2) within which individual electrical components and circuits (e.g., such as memory cell 262) are formed. The lateral edge 256 may be formed by any appropriate die separation technique, such as saw cutting (e.g., along the scribe lines 30 of FIGS. 1 and 2 above) following formation of the electrical components, interconnections, and seal structures described herein. The spacer region 254 thus extends along the lateral periphery of the separated device 200, outlying the active region 250 between the side seal structure boundary and the lateral sides 256 thereof.

However, as illustrated in FIG. 12a, the formation of the upper insulator layer 222 over the final metal layer (including the upper most metal dies seal structure 290c) creates a moisture leakage path along which moisture 246 may enter the active region 250 and expose the components therein (e.g., cell 262) to adverse effects thereof. In accordance with the present invention, the edge or end portions of the device 200 may be processed in order to form an upper seal layer 240 overlying the upper insulator layer 222 and an exposed portion of the upper metal die seal structure 290c, by which the top seal layer 240 and the side seal structure cooperate to protect the active region 250 of the device from moisture 246, as illustrated and described further below with respect to FIGS. 13–22.

Figure 13:
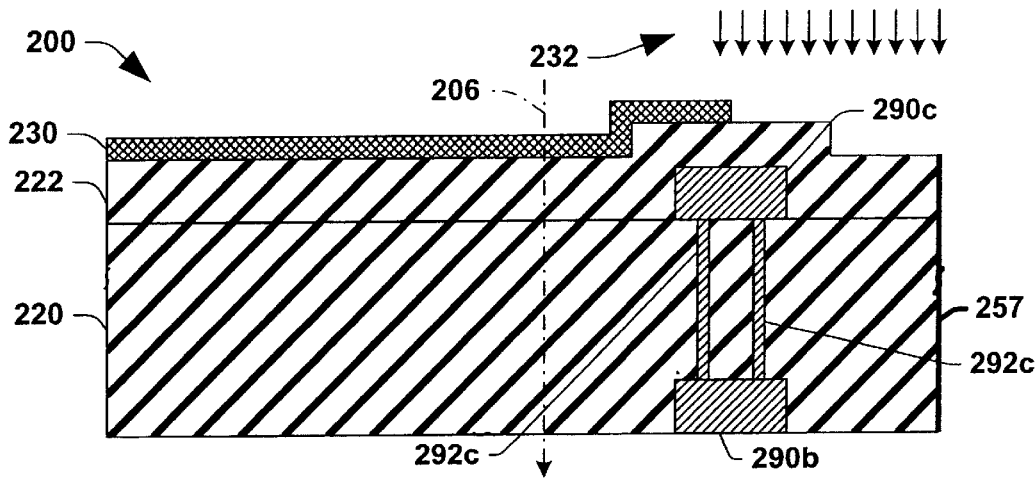
FIG. 13 is a partial side elevation view in section illustrating an end portion of another semiconductor device and selective removal of portions of an upper insulator layer to expose a portion of a seal structure using a first pad mask in accordance with the present invention.
Figure 14:
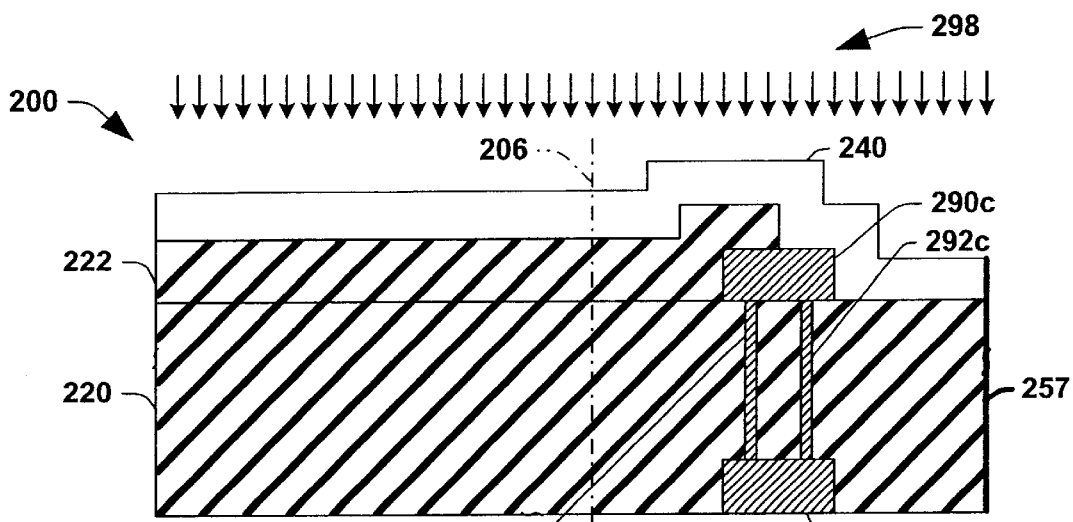
FIG. 14 is a partial side elevation view in section illustrating formation of an upper seal layer overlying the upper insulator layer and an exposed portion of the seal structure of FIG. 13.
Figure 15:
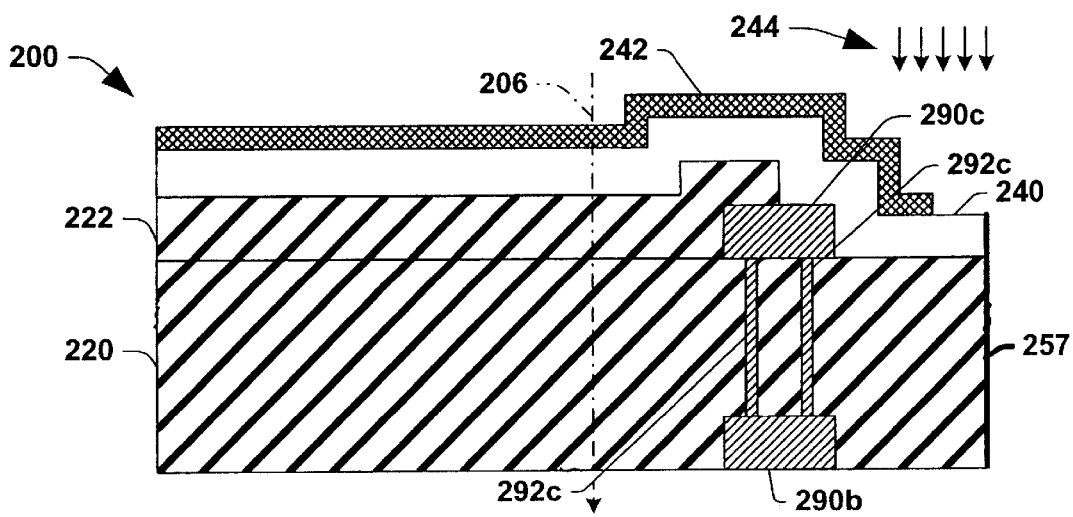
FIG. 15 is a partial side elevation view in section illustrating removal of an end portion of the upper seal layer of FIG. 14 using a second pad mask.
Figure 16:
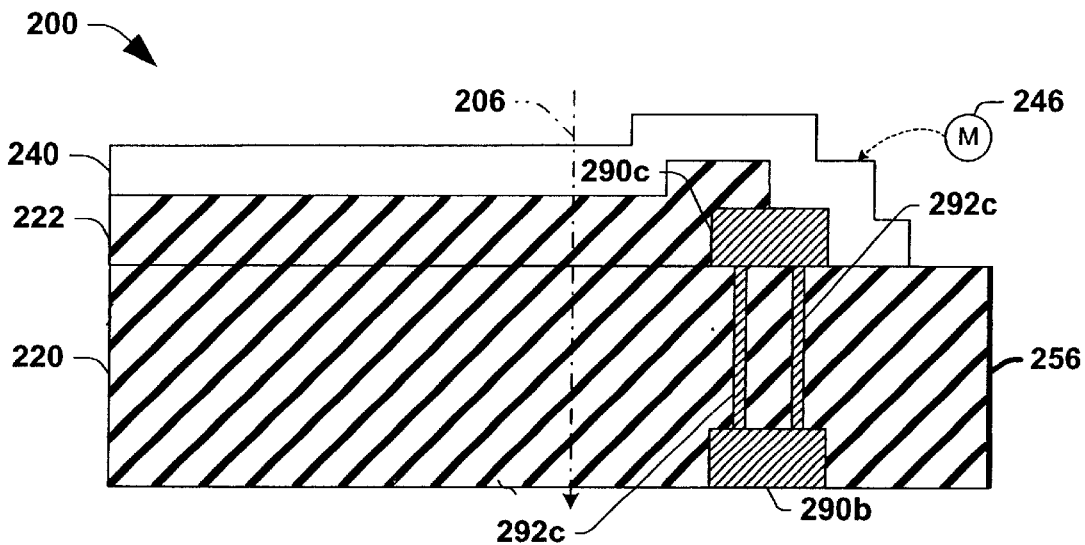
FIGS. 16 and 17 are partial side elevation views in section illustrating the device of FIG. 15 following removal of an end portion of the upper seal layer and the moisture seal features thereof.

Referring now to FIGS. 13–17, an end portion of the device 200 is illustrated in FIG. 13 prior to selective etching of the upper insulator layer 222 (e.g., see also FIG. 6 above). A scribe line 257 indicates the prospective edge of the device 200 following die separation. According to one implementation of the invention, a portion of the upper metal die seal structure 290c is exposed through the insulation layer 222 using the first pad mask 230 and the etch process 232. Thereafter the first pad mask 230 is removed and a SiN deposition process 298 is performed on the device 200 in FIG. 14 so as to form the upper seal layer 240 overlying the insulator layer 222 and the exposed portion of the metal die seal structure 290c. Referring also to FIG. 15, in order to facilitate die separation using a saw blade (not shown), the second pad mask 242 may be formed on the device 200 so as to expose an edge portion of the seal layer 240 to the SiN etch process 244, by which the edge of the spacer region 254 at the scribe line 257 is void of SiN material. As illustrated in FIG. 16, die separation may thereafter be performed to form the lateral side 256.

Figure 17:
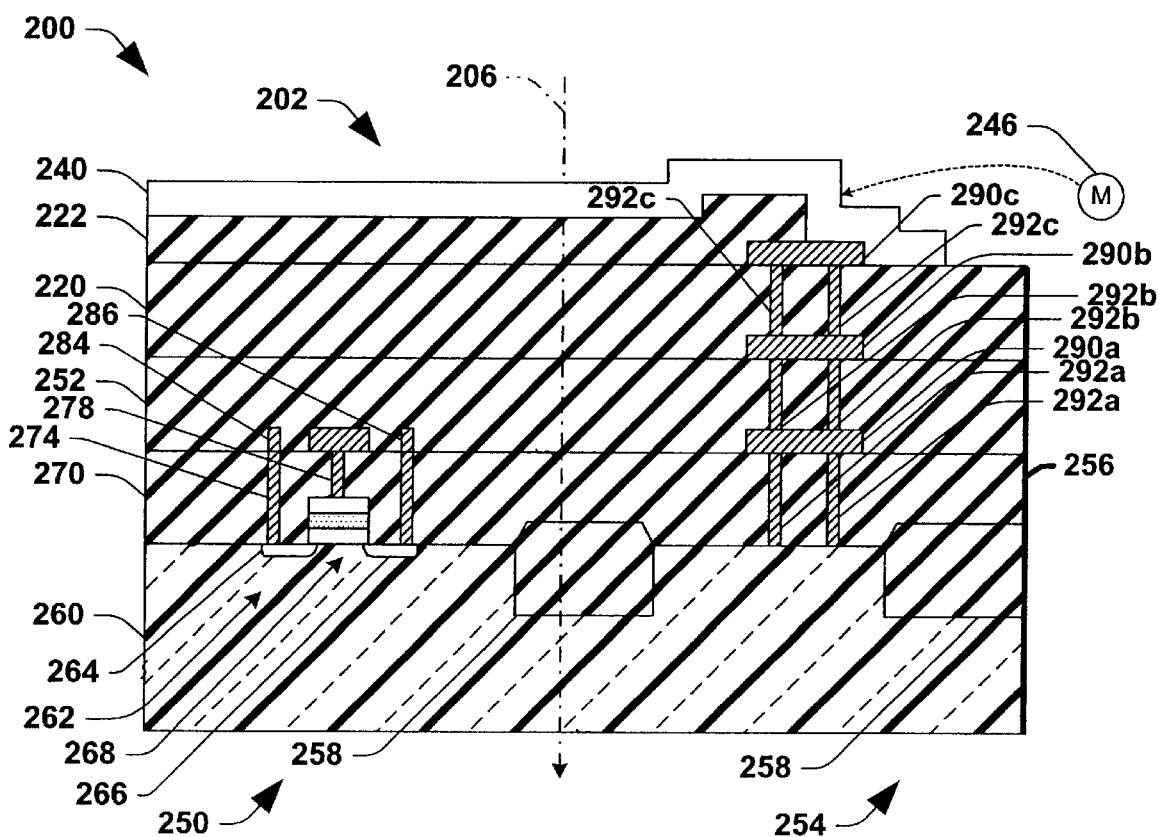

As illustrated in FIGS. 16 and 17, the formation of the upper insulation layer 222 over the upper metal layer allows close line feature spacing in the upper metal layer without the capacitance problems associated with SiN. At the same time, the provision of the upper seal layer 240 overlying the upper insulator layer 222 and the exposed portion of the upper most die seal metal structure 290c provides cooperation between the side seal structure and the upper seal layer 240 so as to protect the active region 250 of the device 200 against moisture 246. The implementation of FIGS. 13–17 provides certain advantages for relatively small die seal structures (e.g., structures 290). For instance, it is noted that the exposure of the a portion of the structure 290c through the SiO layer 222 via the first pad mask 230 (e.g., FIG. 13) is done prior to die separation. Thus, the opening in the first pad mask 230 to accomplish this can be relatively large, while the alignment of the edge of the mask 230 with the die seal metal structure 290c can be anywhere within the lateral width of the structure 290c. This allows the use of relatively inexpensive photolithography tools for performing the first pad masking. The opening for this purpose in the first pad mask 230 (e.g., as well as that of the second pad mask 242 (FIG. 15) is relatively large, as the opening extends to the corresponding lateral die seal structure of the adjacent die (not shown) in the wafer.

Figure 18:
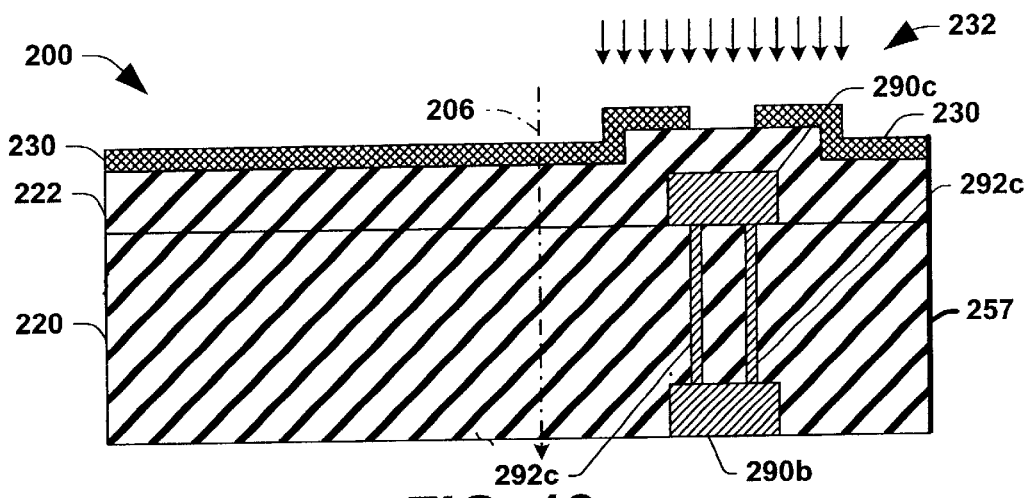
FIG. 18 is a partial side elevation view in section illustrating an end portion of another semiconductor device and selective removal of portions of an upper insulator layer to expose a portion of a seal structure using a first pad mask in accordance with the invention.
Figure 19:
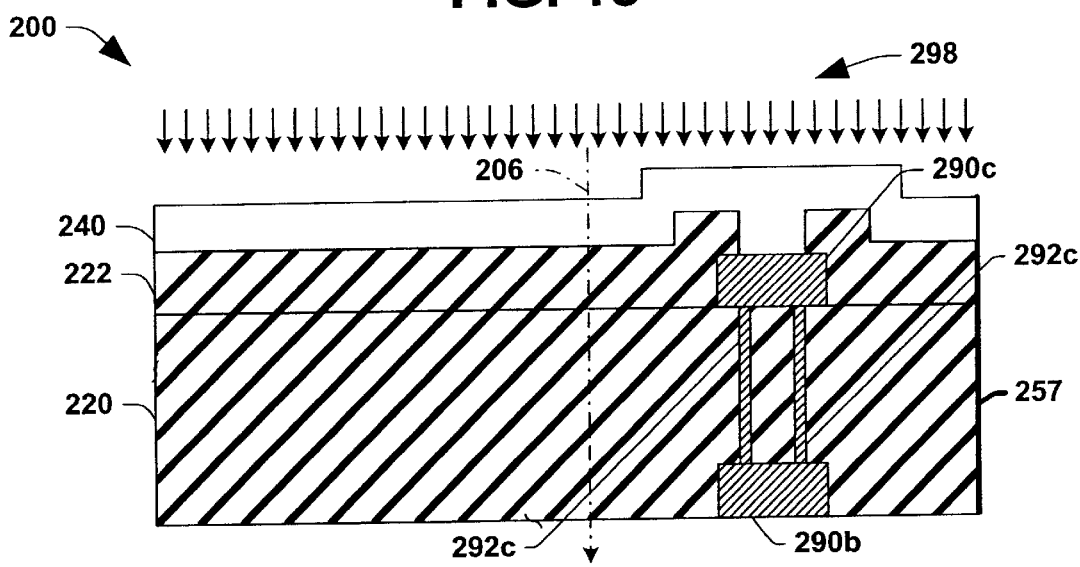
FIG. 19 is a partial side elevation view in section illustrating formation of an upper seal layer overlying the upper insulator layer and the exposed portion of the seal structure of FIG. 18.
Figure 20:
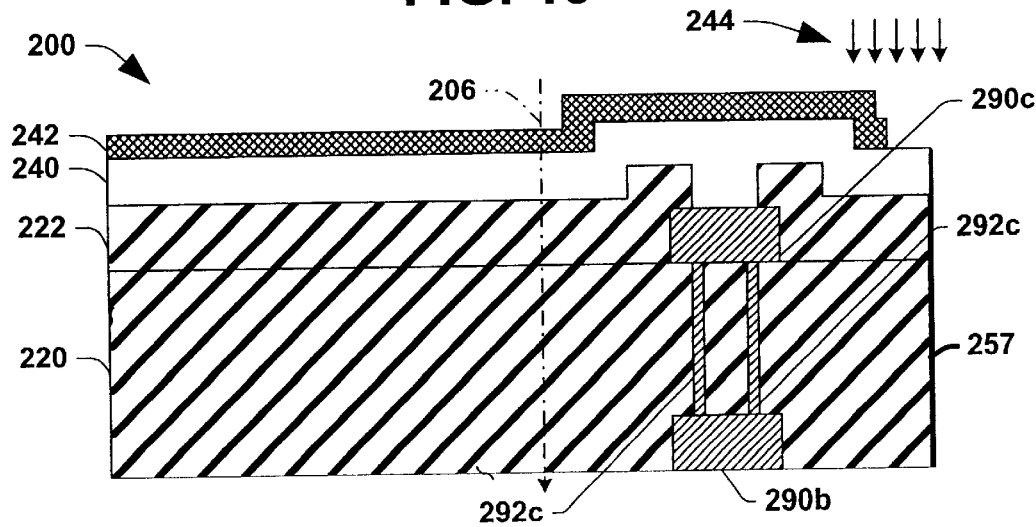
FIG. 20 is a partial side elevation view in section illustrating removal of an end portion of the upper seal layer of FIG. 19 using a second pad mask.
Figure 21:
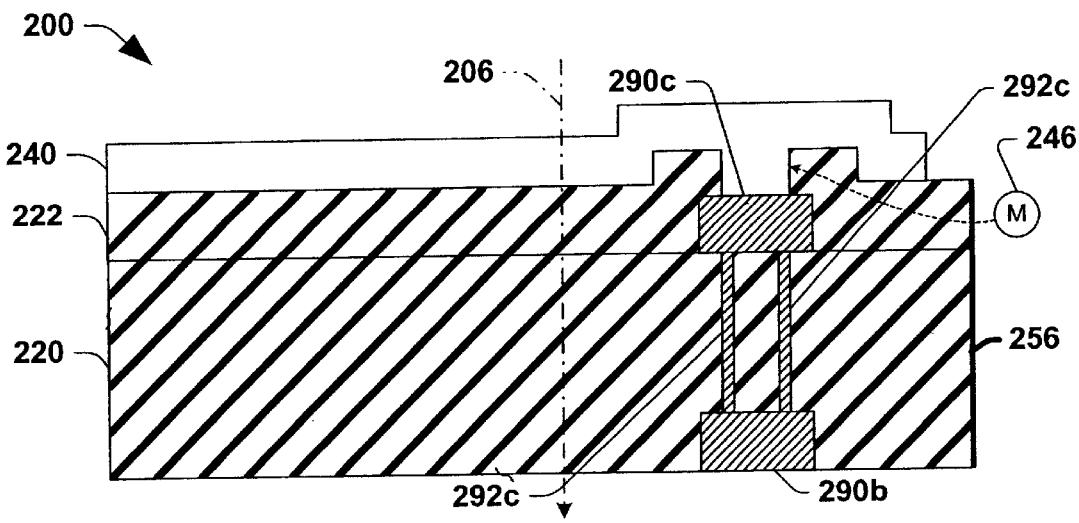
FIGS. 21 and 22 are partial side elevation views in section illustrating the device of FIG. 20 following removal of an end portion of the upper seal layer and the moisture seal features thereof.

Another implementation of the present invention is illustrated and described below with respect to FIGS. 18–22. In FIG. 18, an end portion of the device 200 is illustrated prior to selective etching of the upper insulator layer 222. A portion of the upper metal die seal structure 290c is exposed through the insulation layer 222 using the first pad mask 230 and the etch process 232. Unlike the implementation of FIGS. 13–17, the first pad mask 230 in FIG. 18 has an opening laterally between the edges of the metal die seal feature 290c, and overlies the portion of the SiO layer 222 between the structure 290c and the scribe line 257. Following the etching operation 232 of FIG. 18, the first pad mask 230 is removed and a SiN deposition process 298 is performed on the device 200 in FIG. 19 so as to form the upper seal layer 240 overlying the insulator layer 222 and the exposed portion of the metal die seal structure 290c. Referring also to FIG. 20, the second pad mask 242 may be formed on the device 200 so as to expose an edge portion of the seal layer 240 to the SiN etch process 244, by which the edge of the spacer region 254 of the device 200 at the scribe line 257 is void of SiN material. As illustrated in FIG. 21, die separation is then performed to establish the lateral side 256 (e.g., via saw cutting or the like).

Figure 22:
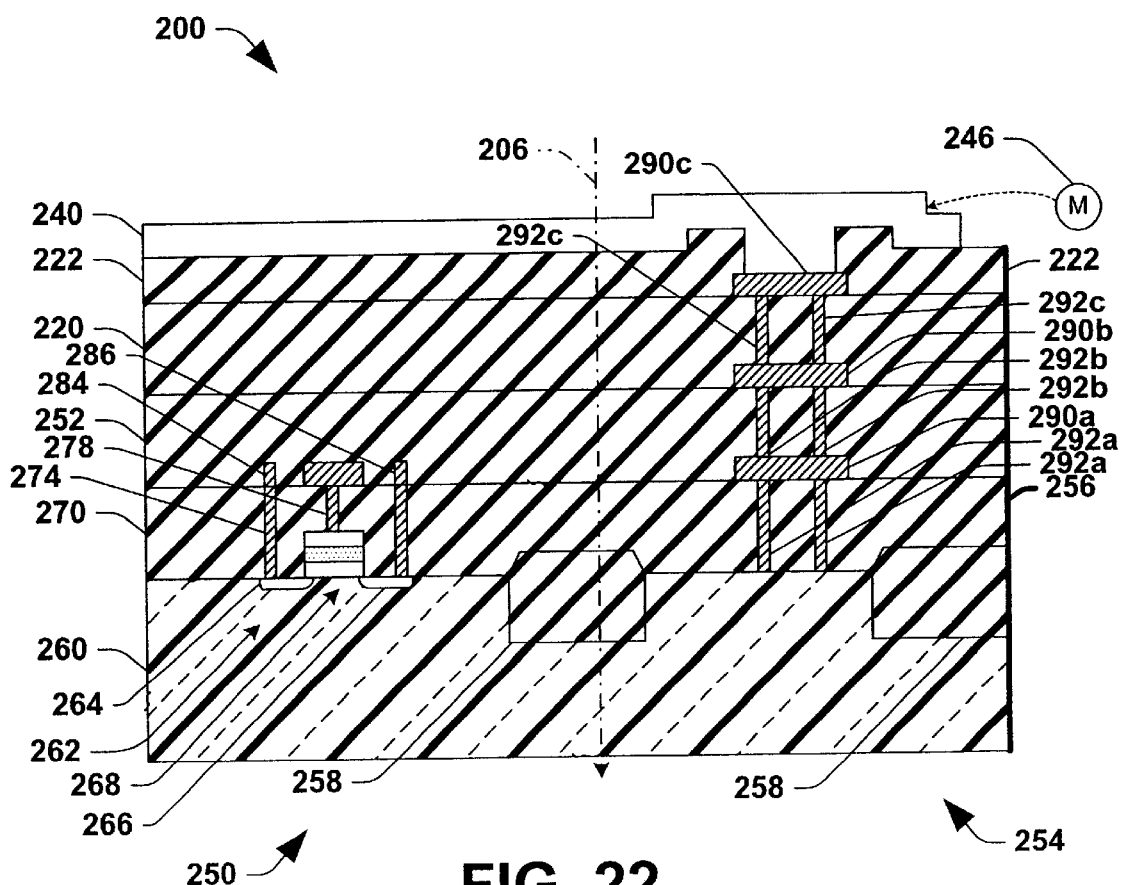

As illustrated in FIGS. 21 and 22, the formation of the upper insulation layer 222 directly over the upper metal layer allows close line feature spacing without the capacitance problems associated with SiN overlying the upper metal layer (e.g., as illustrated and described above with respect to FIG. 4). The upper seal layer 240 overlying the upper insulator layer 222 and the exposed portion of the die seal metal structure 290c provides cooperation between the side seal structure and the upper seal layer 240, which protects the active region 250 of the device 200 against moisture 246. Many implementations of the present invention are possible within the scope of the appended claims, including but not limited to the implementations illustrated and/or described herein. For example, while the upper seal layer 240 is illustrated and described above as comprising SiN, other equivalent materials may be employed for this layer. Likewise, materials other than SiO may be used for the various insulator layers. Furthermore, the side seal structures illustrated herein are but one example of a side seal structure in accordance with the present invention, and others are possible, for example, in which a single contact 292, or more than two such contacts 292 are employed between the various the seal structures 290.

Figure 23:
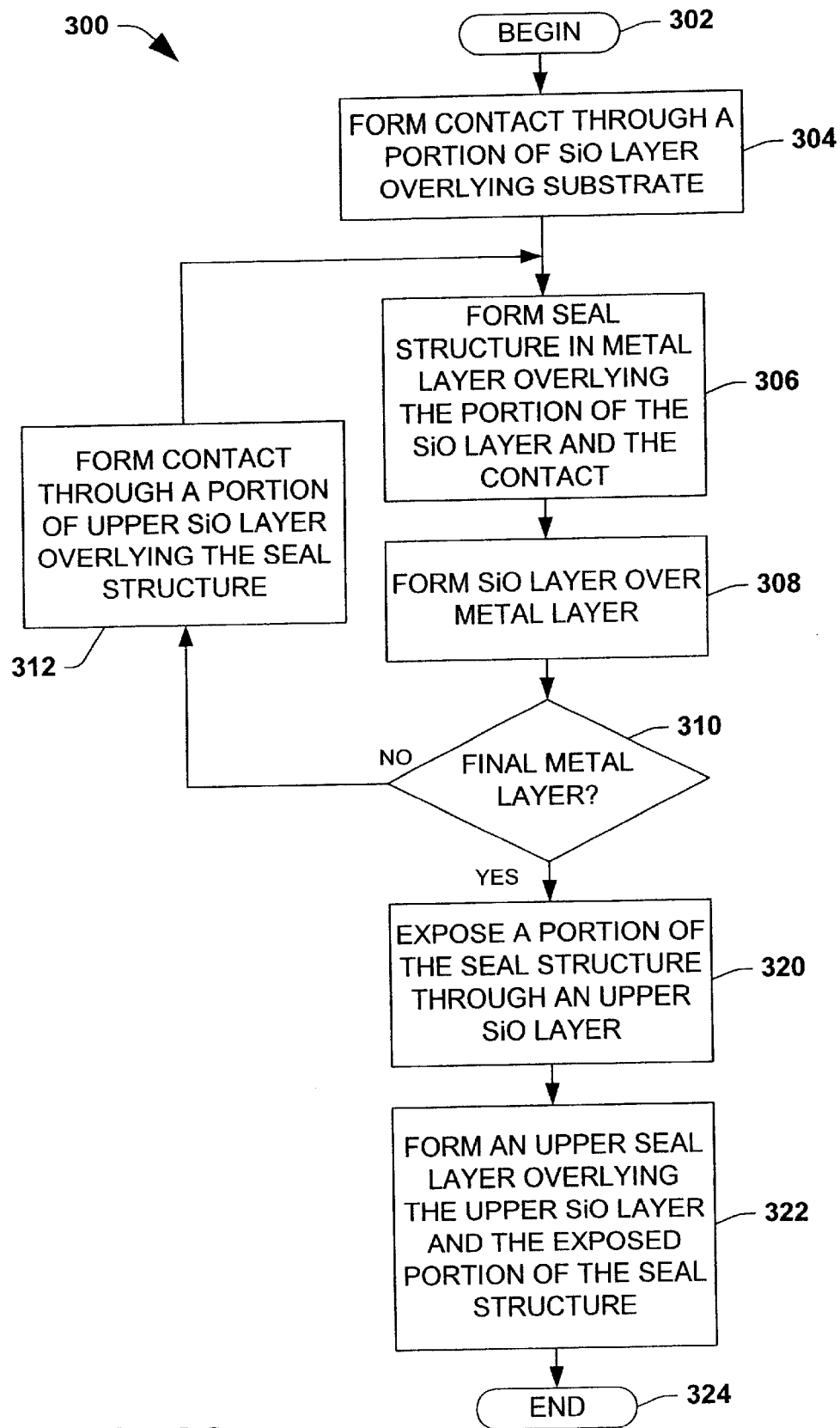
FIG. 23 is a flow diagram illustrating an exemplary method of protecting semiconductor devices against moisture in accordance with another aspect of the present invention.

Referring now to FIG. 23, another aspect of the present invention provides methodologies for protecting semiconductor devices from moisture. In accordance with this aspect of the invention, a seal structure is formed in a final metal layer in the semiconductor device, and an upper insulator layer is formed overlying the final metal layer. The methodologies further comprise exposing a portion of the seal structure through the upper insulator layer and forming an upper seal layer overlying the upper insulator layer and an exposed portion of the seal structure. Although the exemplary method 300 is illustrated and described hereinafter as a series of acts or events, it will be appreciated that the present invention is not limited by the illustrated ordering of such acts or events, as some acts may occur in different orders and/or concurrently with other acts or events apart from those illustrated and/or described herein, in accordance with the invention. In addition, not all illustrated steps may be required to implement a methodology in accordance with the present invention. Moreover, it will be appreciated that the methods according to the present invention may be implemented in association with the apparatus and systems illustrated and described herein as well as in association with other systems not illustrated.

Beginning at 302, the method 302 comprises forming a contact through a portion of an SiO layer (e.g., contacts 292a in layer 270 of FIG. 22) overlying a substrate (e.g., bottom substrate 260). At 306, a seal structure (e.g., structure 290a) is formed in a metal layer overlying the SiO layer and the contact. Then at 308, an SiO or other insulator layer (e.g., layer 252 of FIG. 22) is formed over the metal layer. A determination is made at 310 as to whether the final (e.g., upper most) metal layer has been reached. If not (e.g., "NO" at 310), the method 300 proceeds to 312, whereat a contact is formed through a portion of the SiO layer (e.g., layer 252) overlying the seal structure, and the method 300 returns to 306 as described above. The method is thus repeated through 306–312 until the final metal layer is reached at 310. Thereafter, a portion of the seal structure is exposed at 320 through the upper SiO layer (e.g., layer 222 of FIG. 22). At 322, an upper seal layer (e.g., layer 240) is formed overlying the upper SiO layer and the exposed portion of the seal structure, after which the method 300 ends at 324.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A semiconductor device, comprising:
    a die having a top, a substrate bottom, an axis extending longitudinally between the top and the substrate bottom, and a plurality of sides extending longitudinally between the top and the substrate bottom;
    an active region extending from the substrate bottom to the top, the active region being spaced from and internal to the plurality of sides and having at least one electrical component formed therein;
    a spacer region extending laterally with respect to the axis between the plurality of sides and the active region, and axially between the substrate bottom and the top;
    a side seal structure formed within the spacer region so as to laterally surround the active region and extending from the bottom substrate to the top to provide a lateral moisture barrier between the active region and the plurality of sides; and
    an upper seal structure overlying the active region and contacting the side seal structure along the top so as to provide a longitudinal moisture barrier between the active region and the top.

2. The device of claim 1, wherein the side seal structure comprises a metal seal structure formed in a metal layer in the spacer region and at least one contact formed in an insulator layer overlying the bottom substrate, the at least one contact extending longitudinally between the bottom substrate and the metal seal structure, wherein the metal seal structure and the at least one contact laterally surround the active region to provide a lateral moisture barrier between the active region and the plurality of sides.

3. The device of claim 2, wherein the at least one contact comprises tungsten.

4. The device of claim 2, wherein the upper seal structure comprises an upper seal layer overlying an upper insulator layer and a portion of the metal seal structure at the top.

5. The device of claim 4, wherein the upper seal layer comprises SiN overlying the upper insulator layer and the portion of the metal seal structure.

6. The device of claim 1, wherein the upper seal structure comprises an upper seal layer overlying an upper insulator layer and a portion of the side seal structure at the top.

7. The device of claim 6, wherein the upper seal layer comprises SiN overlying the upper insulator layer and the portion of the side seal structure.

8. A semiconductor device moisture seal for protecting electrical components in a semiconductor device from moisture, the moisture seal comprising:
    a side seal formed within the semiconductor device so as to laterally surround at least one electrical component in the semiconductor device and to provide a lateral moisture barrier between the at least one electrical component and an exterior of the semiconductor device; and
    an upper seal overlying an upper insulator layer in the semiconductor device and contacting the side seal so as to provide a longitudinal moisture barrier between the at least one electrical component and the exterior of the semiconductor device.

9. The moisture seal of claim 8, wherein the side seal comprises a metal seal structure formed in a metal layer in the semiconductor device and at least one contact formed in an insulator layer overlying a bottom substrate in the semiconductor device, the at least one contact extending longitudinally between the bottom substrate and the metal seal structure, wherein the metal seal structure and the at least one contact laterally surround the at least one electrical component.

10. The moisture seal of claim 9, wherein the at least one contact comprises tungsten.

11. The moisture seal of claim 9, wherein the upper seal comprises an upper seal layer overlying an upper insulator layer and a portion of the metal seal structure at the top.

12. The moisture seal of claim 11, wherein the upper seal layer comprises SiN overlying the upper insulator layer and the portion of the metal seal structure.

13. The moisture seal of claim 8, wherein the upper seal comprises a SiN layer overlying an upper insulator layer and a portion of the side seal.

14. A semiconductor device, comprising:
a die having a top, a substrate bottom, an axis extending longitudinally between the top and the substrate bottom, and a plurality of sides extending longitudinally between the top and the substrate bottom;
an active region extending from the substrate bottom to the top, the active region being spaced from and internal to the plurality of sides and having at least one electrical component formed therein;
a spacer region extending laterally with respect to the axis between the plurality of sides and the active region, and axially between the substrate bottom and the top;
a side seal structure formed within the spacer region so as to laterally surround the active region and extending from the bottom substrate to the top to provide a lateral moisture barrier between the active region and the plurality of sides;
an upper insulator layer overlying an upper most metal layer; and
an upper seal structure overlying the upper insulator layer in the active region and contacting the side seal structure along the top so as to provide a longitudinal moisture barrier between the active region and the top.

15. The device of claim 14, wherein the side seal structure comprises a metal seal structure formed in a metal layer in the spacer region and at least one contact formed in an insulator layer overlying the bottom substrate, the at least one contact extending longitudinally between the bottom substrate and the metal seal structure, wherein the metal seal structure and the at least one contact laterally surround the active region to provide a lateral moisture barrier between the active region and the plurality of sides.

16. The device of claim 15, wherein the at least one contact comprises tungsten.

17. The device of claim 15, wherein the upper seal structure comprises an upper seal layer overlying the upper insulator layer and a portion of the metal seal structure at the top.

18. The device of claim 17, wherein the upper seal layer comprises SiN overlying the upper insulator layer and the portion of the metal seal structure.

19. The device of claim 14, wherein the upper seal structure comprises an upper seal layer overlying the upper insulator layer and a portion of the side seal structure at the top.

20. The device of claim 19, wherein the upper seal layer comprises SiN overlying the upper insulator layer and the portion of the side seal structure.

* * * * *